United States Patent
Park

(10) Patent No.: US 7,379,358 B2
(45) Date of Patent: May 27, 2008

(54) REPAIR I/O FUSE CIRCUIT OF SEMICONDUCTOR MEMORY DEVICE

(75) Inventor: Seong Je Park, Suwon-Si (KR)

(73) Assignee: Hynix Semiconductor Inc., Icheon-Si (KR)

( * ) Notice: Subject to any disclaimer, the term of this patent is extended or adjusted under 35 U.S.C. 154(b) by 232 days.

(21) Appl. No.: 11/306,072

(22) Filed: Dec. 15, 2005

(65) Prior Publication Data

US 2007/0165465 A1    Jul. 19, 2007

(30) Foreign Application Priority Data

Jun. 29, 2005   (KR)   ...................... 10-2005-0057281

(51) Int. Cl.
*G11C 7/00*   (2006.01)

(52) U.S. Cl. .................................... 365/200; 365/225.7

(58) Field of Classification Search ............ 365/225.7, 365/200, 189.05, 189.08, 226, 229, 230.08, 365/185.09
See application file for complete search history.

(56) References Cited

U.S. PATENT DOCUMENTS

| 4,689,494 | A | * | 8/1987 | Chen et al. | ................... | 365/200 |
| 4,714,839 | A | * | 12/1987 | Chung | ........................ | 365/200 |
| 5,134,583 | A | * | 7/1992 | Matsuo et al. | ............... | 365/200 |
| 5,455,798 | A | * | 10/1995 | McClure | ..................... | 365/200 |
| 5,457,656 | A | * | 10/1995 | Fu | ............................... | 365/200 |
| 5,548,555 | A | * | 8/1996 | Lee et al. | .................... | 365/200 |
| 5,852,580 | A | * | 12/1998 | Ha | .............................. | 365/200 |
| 5,995,422 | A | * | 11/1999 | Im et al. | ..................... | 365/200 |
| 6,026,037 | A | * | 2/2000 | Hong | .......................... | 365/200 |
| 6,118,712 | A | * | 9/2000 | Park et al. | ................... | 365/200 |
| 6,122,206 | A | * | 9/2000 | Fujita | ......................... | 365/200 |
| 6,345,003 | B1 | * | 2/2002 | Choi | ........................... | 365/200 |
| 6,456,546 | B2 | * | 9/2002 | Kim et al. | ................... | 365/200 |
| 6,496,426 | B2 | * | 12/2002 | Jeon et al. | ................... | 365/200 |
| 6,992,945 | B2 | * | 1/2006 | Otsuka | ...................... | 365/225.7 |
| 7,027,330 | B2 | * | 4/2006 | Park | ........................... | 365/200 |
| 7,075,848 | B2 | * | 7/2006 | Choi et al. | ............... | 365/225.7 |

FOREIGN PATENT DOCUMENTS

| KR | 10-1996-0008827 | 7/1996 |
| KR | 10-2000-0020949 | 4/2000 |
| KR | 10-2004-0065776 | 7/2004 |

* cited by examiner

*Primary Examiner*—Trong Phan
(74) *Attorney, Agent, or Firm*—Marshall, Gerstein & Borun LLP

(57) ABSTRACT

A repair I/O fuse circuit of a semiconductor memory device includes a reduced by as much as half layout area of fuses by replacing what one repair I/O information is represented by existing two I/O fuses with what one repair I/O information is represented by one I/O fuse. The repair I/O fuse circuit includes a plurality of I/O fuse circuits, each having one fuse. A repair signal indicates that there is an address to be replaced. If a chip enable signal is activated, each of the plurality of I/O fuse circuits outputs a repair I/O information signal depending on whether a fuse has been cut.

16 Claims, 2 Drawing Sheets

000
REPAIR I/O FUSE CIRCUIT OF SEMICONDUCTOR MEMORY DEVICE

TECHNICAL FIELD

This patent relates to a repair I/O fuse circuit of a semiconductor memory device, and more specifically, to a repair I/O fuse circuit in which the number of fuses is reduced.

DISCUSSION OF RELATED ART

A semiconductor memory device includes redundancy cells capable of repairing fail cells. To control the redundancy cells, an address fuse and an I/O fuse are used.

FIG. 1 is a circuit diagram of a repair I/O fuse circuit in the related art.

Referring to FIG. 1, a PMOS transistor P1 which is connected to a VCC is always turned on according to a TRED signal always having logic low. If a repair signal REPb becomes logic low and thus indicates that an address to be replaced has been detected, PMOS transistors P2 to P5 are turned on and are all turned on since the repair signal REPb is inverted by an inverterIV1. At this time, one of I/O fuses F1 and F2 is cut to output a repair I/O information signal IOBUS<0> as logic high or logic low, one of I/O fuses F3 and F4 is cut to output a repair I/O information signal IOBUS <1 > as logic high or logic low, one of fuses P5 and F6 is cut to output a repair I/O information signal IOBUS<2> as logic high or logic low, and one of fuses F7 and F8 is cut to output a repair I/O information signal IOBUS<3> as logic high or logic low. One terminal each Fuses F1 to F8 is connected to VSS.

In the above-described repair I/O fuse circuit, however, two I/O fuses (e.g., F1, F2) that store repair I/O information represent one repair I/O information signal IOBUS<0>. These I/O fuses occupy a greater amount of a layout area than that of a MOS transistor. Therefore, an increase in the number of I/O fuses results an increased die size.

SUMMARY OF THE INVENTION

A repair I/O fuse circuit of a semiconductor memory device is reduced by as much as half by replacing what one repair I/O information is represented by existing two I/O fuses with what one repair I/O information is represented by one I/O fuse.

A repair I/O fuse circuit of a semiconductor memory device may include a plurality of I/O fuse circuits that output repair I/O information signals depending on whether a fuse has been cut, respectively, in response to a repair signal and a chip enable signal. Each of the plurality of I/O fuse circuits includes one fuse, wherein the repair signal indicates that there is an address to be replaced, and if the chip enable signal is activated, each of the plurality of I/O fuse circuits outputs the repair I/O information signal depending on whether the fuse has been cut.

A repair I/O fuse circuit of a semiconductor memory device may include a plurality of I/O fuse circuits that output repair I/O information signals depending on whether a fuse has been cut, respectively, in response to a repair signal and a chip enable signal. Each of the plurality of fuse circuits includes a feedback unit that combines one of the plurality of repair I/O information signals and the chip enable signal to output a feedback signal, a fuse unit that includes one fuse, outputs an output signal depending on whether the fuse has been cut and operates in response to the repair signal and the feedback signal, and a buffer unit that outputs one of the plurality of repair I/O information signals in response to the output signal of the fuse unit and the repair signal.

DETAILED DESCRIPTION OF PREFERRED EMBODIMENTS

Figure 1:
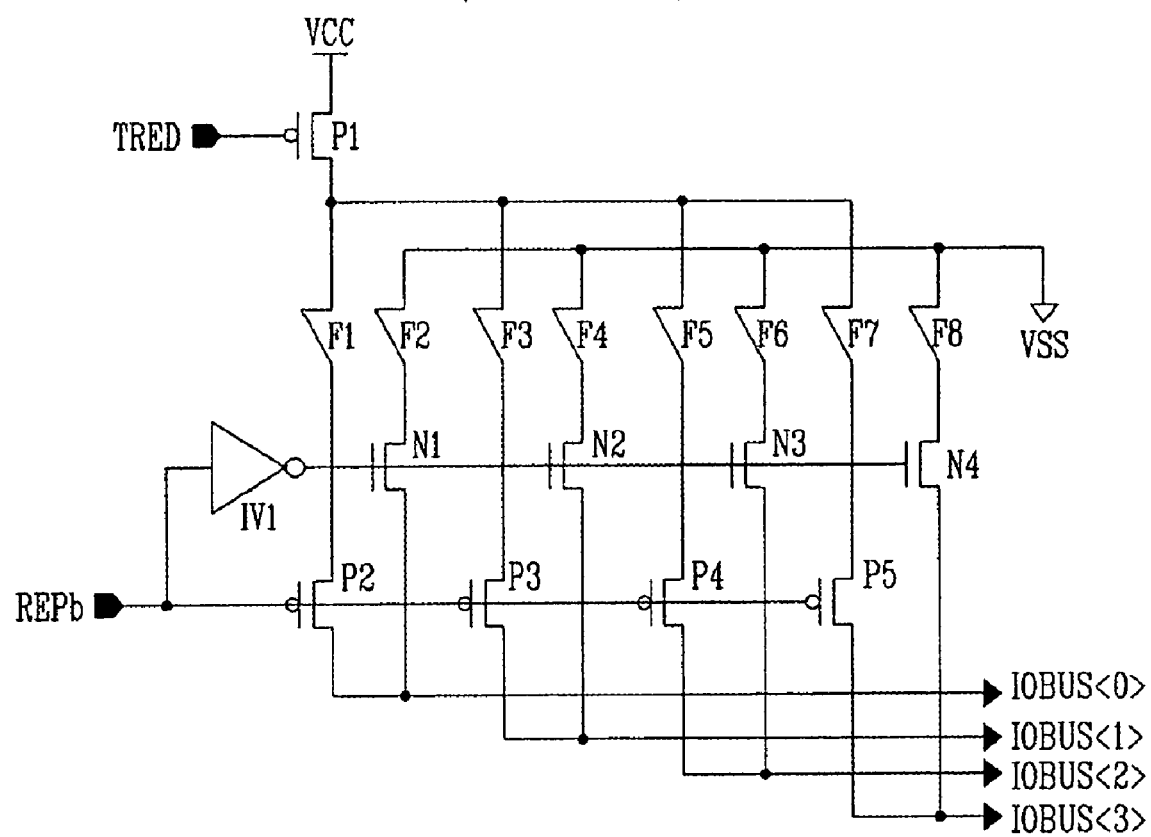
FIG. 1 is a circuit diagram of a repair I/O fuse circuit in the related art.
Figure 2:
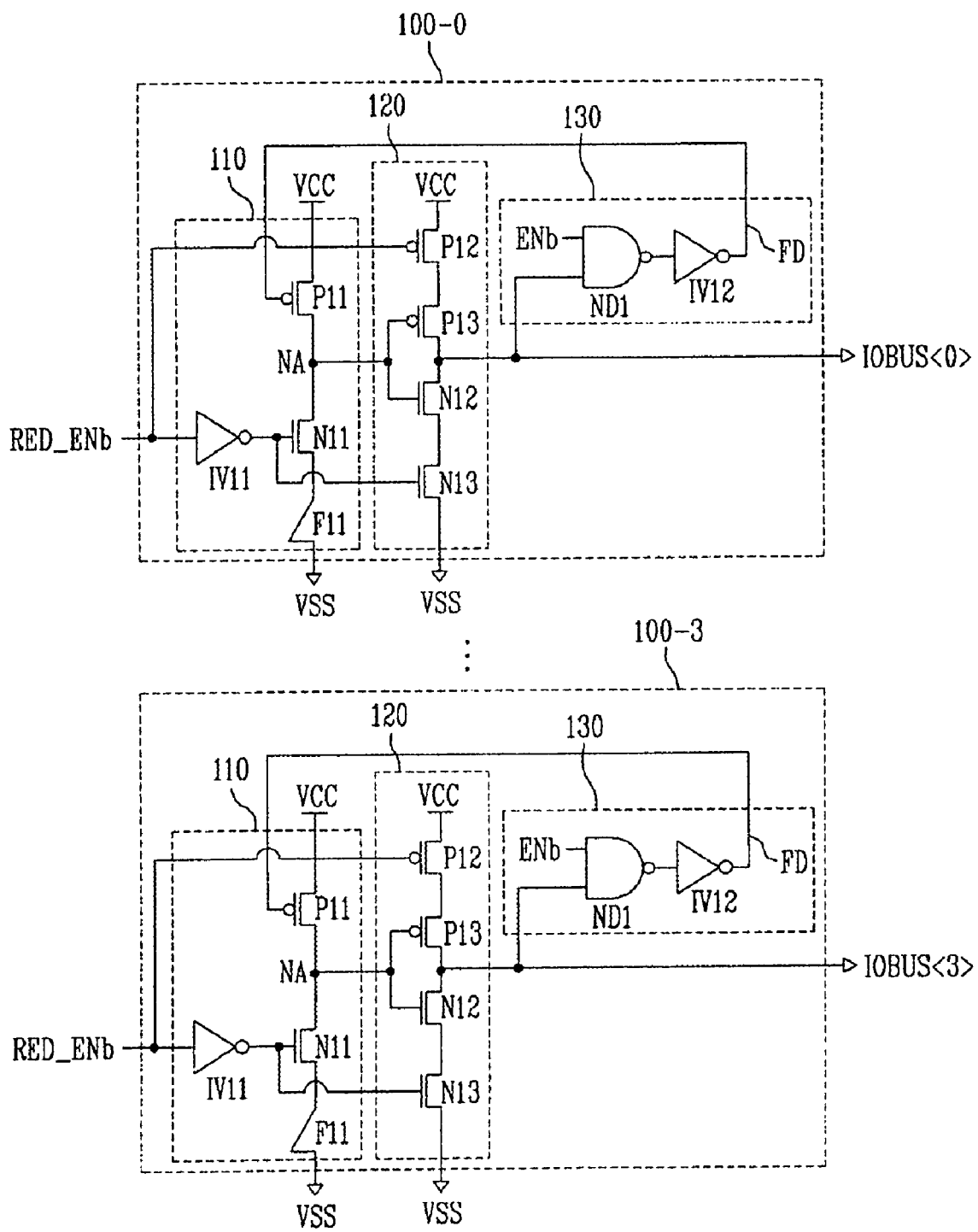
FIG. 2 is a circuit diagram of a repair I/O fuse circuit according to a herein described embodiment.

FIG. 2 is a circuit diagram of a repair I/O fuse circuit.

Referring to FIG. 2, the repair I/O fuse circuit may include a plurality of I/O fuse circuits, four being illustrated as fuse circuits 100-0 to 100-3. It has been shown in FIG. 2 that the number of the I/O fuses is four. It is, however, to be understood that the number of the I/O fuses is not limited to the above.

The I/O fuse circuit 100-0 may include a fuse unit 110, a 3-state buffer unit 120 and a feedback unit 130. The fuse unit 110 receives a repair signal RED_Enb and a feedback signal FD and outputs a signal having a voltage level depending on whether a fuse has been cut. The 3-state buffer unit 120 receives the feedback signal FD, the output signal of the fuse unit 110 and an inverting signal of the repair signal RED_Enb, inverts the output signal of the fuse unit 110, and outputs a repair I/O information signal IOBUS<0>. The repair I/O information signal is loaded on an I/O bus (not shown). The feedback unit 130 logically combines the chip enable signal ENb and the output signal of the 3-state buffer unit 120 and outputs the feedback signal FD.

The fuse unit 110 may include an inverter IV11, a PMOS transistor P11, a NMOS transistor P12 and a fuse F11. The inverter IV11 inverts the repair signal RED_ENb. The PMOS transistor P11 is connected between a power supply voltage VCC and a node NA and has the gate to which the feedback signal FD is input. The PMOS transistor P11 is a weak transistor, which is weakly (i.e., very small) is turned on according to the feedback signal FD. A NMOS transistor N11 and the fuse F11 is connected in series between the node NA and a ground voltage VSS. The NMOS transistor N11 has the gate to which the output signal of the inverter IV11 is input.

The 3-state buffer unit 120 may include PMOS transistors P12, P13 and NMOS transistors N12, N13. The PMOS transistors P12, P13 are connected in series between the power supply voltage VCC and an output terminal. The PMOS transistor P12 receives the repair signal RED_ENb through its gate. The PMOS transistor P13 receives a signal of the node NA through its gate. The NMOS transistors N12, N13 are connected between the output terminal and the ground voltage VSS. The NMOS transistor N12 receives a signal of the node NA through its gate. The NMOS transistor N13 receives the output signal of the inverter IV11 through its gate.

The feedback unit 130 may include a NAND gate ND1 and an inverter IV2. The NAND gate N1 performs a NAND operation on a chip enable signal ENb and the output signal of the 3-state buffer 120. The inverter IV12 inverts the output signal of the NAND gate ND1 and outputs the feedback signal FD.

The remaining I/O fuse circuits 100-1 to 100-3 have the same construction as that of the aforementioned I/O fuse circuit 100-0 and operate according to the same input signal. Description thereof will be omitted.

Hereinafter, the operation of the repair I/O fuse circuit according to a preferred embodiment of the present invention will be described with reference to FIG. 2.

If the repair signal RED_ENb is applied as logic low and the chip enable signal ENb is applied as logic low, the PMOS transistors P11, P12 and the NMOS transistors N11, N13 are all turned on. At this time, if the fuse F11 within the I/O fuse circuit 100-1 has not been cut, the node NA has the level of the ground voltage VSS level since the PMOS transistor P11 is a weak transistor. That is, although the current by the power supply voltage VCC collides against the current by the ground voltage VSS, the amount of current by the ground voltage VSS becomes greater than those by the power supply voltage VCC, so that the node NA has the level of the ground voltage VSS.

Meanwhile, if the fuse F11 within the I/O fuse circuit 100-1 has been cut, the current by the ground voltage VSS is cut and the node NA has the level of the power supply voltage VCC. If the node NA has the level of the ground voltage VSS since the fuse F11 is not cut, the PMOS transistors P12, P13 are turned on. Therefore, the repair I/O information signal IOBUS<0> becomes logic high and thus loaded on a corresponding I/O bus (not shown). If the node NA has the level of the power supply voltage VCC since the fuse F11 is cut, the NMOS transistors N12, N13 are cut. Therefore, the repair I/O information signal IOBUS<0> becomes logic low and thus loaded on a corresponding I/O bus (not shown).

If the chip enable signal ENb becomes logic high with the repair signal RED_ENb becoming logic low, i.e., a chip is in standby mode, the PMOS transistor P11 is turned on and an active current is not generated accordingly. The PMOS transistor P12 and the NMOS transistors N11, N13 are turned on according to the repair signal RED_ENb. At this time, if the fuse F11 has not been cut, the node NA becomes the level of the ground voltage VSS and both the PMOS transistors P12, P13 are turned on. Therefore, the repair I/O information signal IOBUS<0> becomes logic high and thus has repair I/O information. Meanwhile, if the fuse F11 has been cut, the repair I/O information signal IOBUS<0> is floated since the current does not flow through the node NA.

If the repair signal RED_ENb becomes logic high and the chip enable signal ENb is logic low, the PMOS transistor P11 is turned on and the NMOS transistors N11, N13 are turned off. Therefore, the node NA becomes the level of the power supply voltage VCC regardless of whether the fuse F11 has been cut. In this case, since the PMOS transistors P12, P13 are turned on and the NMOS transistor N13 is turned off, the repair I/O information signal IOBUS<0> becomes floated. If the chip enable signal ENb becomes logic high with the repair signal RED_ENb becoming logic high, i.e., a chip is in standby mode, both the PMOS transistor P11 and the NMOS transistor N11 are turned on and the repair I/O information signal IOBUS<0> becomes floated regardless of whether the fuse F11 has been cut.

The remaining I/O fuse circuits 100-1 to 100-3 to generate I/O repair information signals IOBUS<1> to IOBUS<3> have the same operation as that of the aforementioned I/O fuse circuit 100-0. Description thereof will be omitted in order to avoid redundancy.

As described above, in the case where the repair signal RED_ENb becomes logic low top indicate that an address to be replaced has been detected and the chip enable signal ENb is enabled as logic low, if the fuse F11 has been cut, the repair I/O information signal IOBUS<i> becomes logic low, and if the fuse F11 has not been cut, the repair I/O information signal IOBUS<i> becomes logic high. Meanwhile, if the repair signal RED_ENb becomes logic high, it means that there is no address to be replaced. Therefore, the repair I/O information signal IOBUS<i> becomes floated regardless of a logic state of the chip enable signal ENb.

An I/O fuse circuit uses one fuse in order to represent one repair I/O information (i.e., in order to output one repair I/O information signal). The I/O fuse circuit has a large number of MOS transistors, but a small number of fuses in comparison with the prior art. That is, since MOS transistors do not occupy a large layout area, the layout area can be significantly reduced by reducing the number of fuses that occupy lots of the layout area.

As described above, the number of fuses can be reduced approximately by half in comparison with the related art. Therefore, it is possible to reduce a layout area, i.e., a chip area by half compared with the prior art.

Although the foregoing description has been made with reference to various embodiments, it is to be understood that changes and modifications of the present invention may be made by the person of ordinary skill in the art without departing from the spirit and scope of the present invention defined by the appended claims.

What is claimed is:

1. A repair I/O fuse circuit of a semiconductor memory device, comprising:
   a plurality of I/O fuse circuits that output repair I/O information signals depending on whether a fuse has been cut, respectively, in response to a repair signal, a feedback signal which is generated by combining each repair I/O information signal and a chip enable signal,
   wherein each of the plurality of I/O fuse circuits includes one fuse, wherein the repair signal indicates that there is an address to be replaced, and if the chip enable signal is activated, each of the plurality of I/O fuse circuits outputs the repair I/O information signal depending on whether the fuse has been cut.

2. The repair I/O fuse circuit as claimed in claim 1, wherein each of the plurality of I/O fuse circuits makes floated the repair I/O information signal if the repair signal indicates that there is no address to be replaced.

3. The repair I/O fuse circuit as claimed in claim 1, wherein each of the plurality of fuse circuits includes:
   a feedback unit that combines one of the plurality of repair I/O information signals and the chip enable signal to output the feedback signal;
   a fuse unit that outputs a signal having a voltage level depending on whether the fuse has been cut in response to the repair signal and the feedback signal; and
   a buffer unit that outputs one of the plurality of repair I/O information signals in response to the output signal of the fuse unit and the repair signal.

4. The repair I/O fuse circuit as claimed in claim 3, wherein the feedback unit includes:
   a logical element that logically combines the chip enable signal and one of plurality of repair I/O information signals; and
   an inverting element that inverts the output signal of the logical element.

5. The repair I/O fuse circuit as claimed in claim 3, wherein if the fuse has been cut, the fuse unit outputs a power supply voltage through its output terminal, and if the fuse has not been cut, the fuse unit outputs a ground voltage through its output terminal.

6. The repair I/O fuse circuit as claimed in claim 3, wherein the fuse unit includes:

an inverting element that inverts the repair signal;

a first transistor connected between a power supply voltage and an output terminal, for transferring the power supply voltage to the output terminal in response to the feedback signal; and a second transistor and one fuse connected between the output terminal and a ground voltage in series, wherein the second transistor receives an output signal of the inverting element through its gate, and transfers the ground voltage to the output terminal if the fuse has not been cut.

7. The repair I/O fuse circuit as claimed in claim 6, wherein if the chip enable signal is inactivated, i.e., a chip is in standby mode, the first transistor is turned off, thus reducing an active current.

8. The repair I/O fuse circuit as claimed in claim 3, wherein the buffer unit is a 3-state buffer.

9. The repair I/O fuse circuit as claimed in claim 3, wherein the buffer unit includes first to fourth transistors connected between a power supply voltage and a ground voltage in series, wherein the first transistor operates in response to the repair signal, the second and third transistors operate in response to the output signal of the fuse unit, and the fourth transistor operates in response to the inverting signal of the repair signal.

10. A repair I/O fuse circuit of a semiconductor memory device, including a plurality of I/O fuse circuits that output repair I/O information signals depending on whether a fuse has been cut, respectively, in response to a repair signal and a chip enable signal, wherein each of the plurality of fuse circuits comprises:

a feedback unit that combines one of the plurality of repair I/O information signals and the chip enable signal to output a feedback signal;

a fuse unit that includes one fuse, outputs an output signal depending on whether the fuse has been cut and operates in response to the repair signal and the feedback signal; and a buffer unit that outputs one of the plurality of repair I/O information signals in response to the output signal of the fuse unit and the repair signal.

11. The repair I/O fuse circuit as claimed in claim 10, wherein the feedback unit includes:

a logical element that logically combines the chip enable signal and one of plurality of repair I/O information signals; and an inverting element that inverts the output signal of the logical element.

12. The repair I/O fuse circuit as claimed in claim 10, wherein if the fuse has been cut, the fuse unit outputs a power supply voltage through its output terminal, and if the fuse has not been cut, the fuse unit outputs a ground voltage through its output terminal.

13. The repair I/O fuse circuit as claimed in claim 10, wherein the fuse unit includes:

an inverting element that inverts the repair signal;

a first transistor connected between a power supply voltage and an output terminal, for transferring the power supply voltage to the output terminal in response to the feedback signal; and a second transistor and one fuse connected between the output terminal and a ground voltage in series, wherein the second transistor receives an output signal of the inverting element through its gate, and transfers the ground voltage to the output terminal if the fuse has not been cut.

14. The repair I/O fuse circuit as claimed in claim 10, wherein if the chip enable signal is inactivated, i.e., a chip is in standby mode, the first transistor is turned off, thus reducing an active current.

15. The repair I/O fuse circuit as claimed in claim 10, wherein the buffer unit is a 3-state buffer.

16. The repair I/O fuse circuit as claimed in claim 10, wherein the buffer unit includes first to fourth transistors connected between a power supply voltage and a ground voltage in series, wherein the first transistor operates in response to the repair signal, the second and third transistors operate in response to the output signal of the fuse unit, and the fourth transistor operates in response to the inverting signal of the repair signal.

* * * * *